United States Patent [19]
Onetti et al.

[11] Patent Number: 5,798,959
[45] Date of Patent: Aug. 25, 1998

[54] METHOD AND DEVICE FOR SOFT-DRIVING AN ARRAY OF LOGIC GATES AND SUPPRESSION OF SWITCHING DISTORTION

[75] Inventors: Andrea Mario Onetti, Pavia; Sylvia Procurato, Ravenna, both of Italy

[73] Assignee: SGS-Thomson Microelectronics S.r.l., Agrate Brianza, Italy

[21] Appl. No.: 680,393

[22] Filed: Jul. 15, 1996

[30] Foreign Application Priority Data

Jul. 14, 1995 [EP] European Pat. Off. ............ 95830304
Jul. 14, 1995 [EP] European Pat. Off. ............ 95830305

[51] Int. Cl.$^6$ ..................................................... H03K 17/16
[52] U.S. Cl. ........................... 365/26; 365/17; 365/27; 365/97
[58] Field of Search ................................ 326/26, 27, 29, 326/17, 83, 97, 98

[56] References Cited

U.S. PATENT DOCUMENTS

| | | | |
|---|---|---|---|
| 4,611,135 | 9/1986 | Nakayama et al. | 307/572 |
| 4,633,101 | 12/1986 | Masuda et al. | 307/353 |
| 4,683,386 | 7/1987 | Kamikawara | 307/549 |
| 5,003,204 | 3/1991 | Cushing et al. | 326/97 |
| 5,027,019 | 6/1991 | Shiohara | 307/579 |
| 5,121,014 | 6/1992 | Huang | 307/605 |
| 5,216,289 | 6/1993 | Hahn et al. | 326/27 |
| 5,394,034 | 2/1995 | Becker et al. | 326/83 |
| 5,598,107 | 1/1997 | Cabuk | 326/17 |

FOREIGN PATENT DOCUMENTS

59-49009 3/1984 Japan.
60-93812 5/1985 Japan.

*Primary Examiner*—Son T. Dinh
*Attorney, Agent, or Firm*—Seed and Berry LLP

[57] ABSTRACT

Switching distortion in a digitally controlled attenuator is effectively suppressed and soft-switching in passgate arrays, present at a certain point of a logic signal path, is implemented with a minimum number of additional components. The soft switching in passgate arrays is implemented by driving the control nodes of each passgate by an inverter, at least a current terminal of which is made switchable from the respective supply node to a node onto which an appropriate ramp signal toward the potential of the respective supply potential is produced by a suitable controlled ramp generator. The passgates for switching the current terminals of the inverters are controlled by the logic signal that preexisted the intervening switching on the respective signal line of the passgate, and by its inverse. The preexistent logic value is momentarily stored in a latch that is updated at the end of any new switching process. The switching distortion is suppressed by causing a fast turn-on of the selected switch and a slowed-down turn-off of the deselected switch and by connecting in parallel to the portion of the resistive voltage divider pertaining to the change of output tap a shunt resistance, deselected from the signal path downstream of the selected switch. The deselected switch is driven by a ramp of a preset slope. A circuit sensing the sign of the change of attenuation of the contingent command, configures a pair of switches that deselect the shunt resistance.

7 Claims, 7 Drawing Sheets

METHOD AND DEVICE FOR SOFT-DRIVING AN ARRAY OF LOGIC GATES AND SUPPRESSION OF SWITCHING DISTORTION

TECHNICAL FIELD

The present invention relates to logic circuits and more in particular driving circuits of logic gate arrays and suppression of circuit switching distortion.

BACKGROUND OF THE INVENTION

In digital systems employing logic gate arrays on a plurality of signal lines of a certain path, for example passgate arrays, it is often found the case of signal lines that are multiplexed in a mutually exclusive manner.

Figure 1:
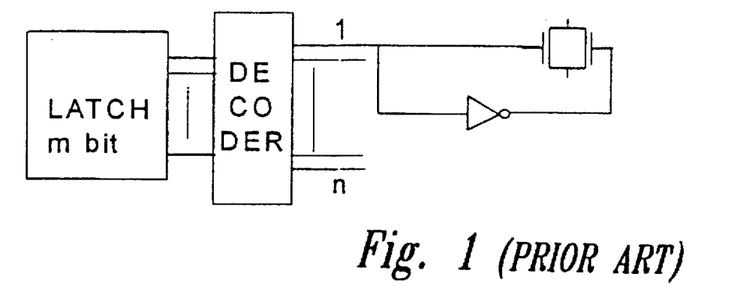
FIG. 1, as already described above, depicts a functional scheme of a passgate array on a certain signal path according to the prior art.

FIG. 1 shows a typical example representing an array of n switches, each of which can be implemented by a passgate constituted by a pair of complementary NMOS and PMOS transistors driven in phase opposition, and wherein the n switches are driven by the outputs of a circuit that decodes an m bit digital command.

A single passgate is eventually turned-on by applying a logic high signal to the gate of the NMOS transistor and a logic low signal to the gate of the PMOS transistor, while all the other passgates are maintained in an OFF condition. Following a switching of the decoder, consequent to the acquisition of a different m bit digital command code, taking place, the passgate that was previously closed is opened simultaneous with closing different passgates of the other n-1 passgates.

As it will be evident to a technician, there are many uses and applications for a digital circuit of this type. For example, in the field of audio processors, for switching among different signal sources, a multiplexer may be used for enabling the selected input leaving all the other disabled. Also in the field of audio applications, it is typical the case of digitally controlled attenuators in which a certain analog signal path is selected by closing a certain switch of a plurality of n switches, which switch selects a certain resistance ratio on an n modules voltage divider, i.e., multi-tap potentiometer. A successive switching, that may be commanded by a new digital code, will open the switch that was previously closed and close a different switch that will select a different resistance ratio of the voltage divider and therefore a new value of attenuation. Even in this case, all the other n-2 switches remain open, being unaffected by the change of attenuation command.

Figure 3:
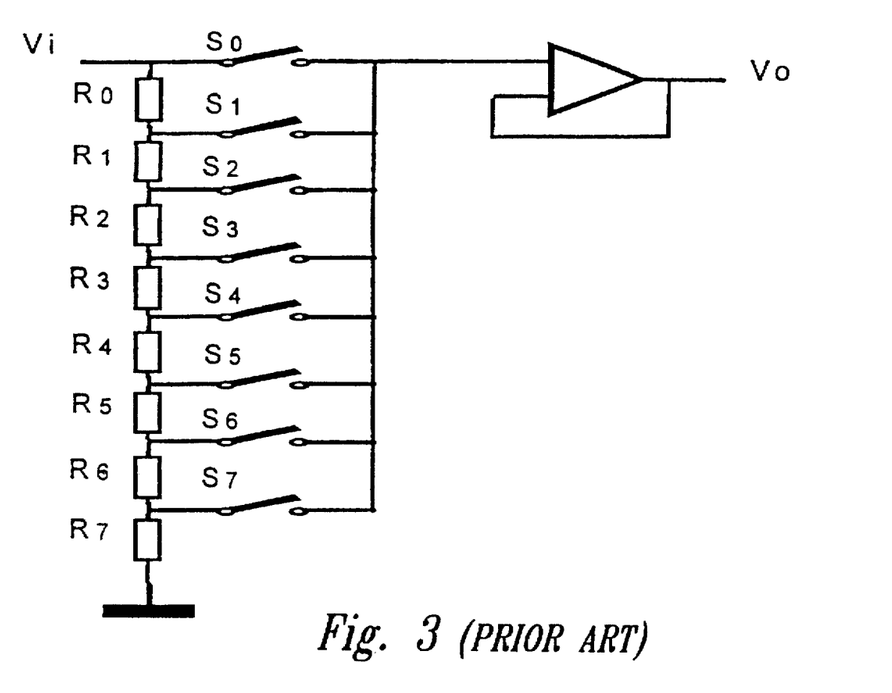
FIG. 3 is a basic circuit diagram of a digitally controlled attenuator, according to the prior art.

According to a prior art scheme as shown in FIG. 3, each selectable switch is capable of connecting a certain tap of the voltage divider to a second circuital node, downstream of said first signal input node of the signal path, for example to the input of an output buffer or coupling buffer. The selection of a particular tap is effected via software command in the form of a "word" composed for example a string of "zeros" and a single "one" that identifies the selected switch using the circuit of FIG. 1. When selecting a different attenuation value, the switches subject to the change of configuration rapidly switch in a mutually exclusive way. The signal is therefore subjected to a higher or lower attenuation in an abrupt manner. When the amplitude variation is relatively large, as in the case of audio systems, this abrupt change may manifest itself by way of a sharp noise (clic). This "switching distortion" is further enhanced when it takes place while the signal is at peak amplitude.

Figure 4:
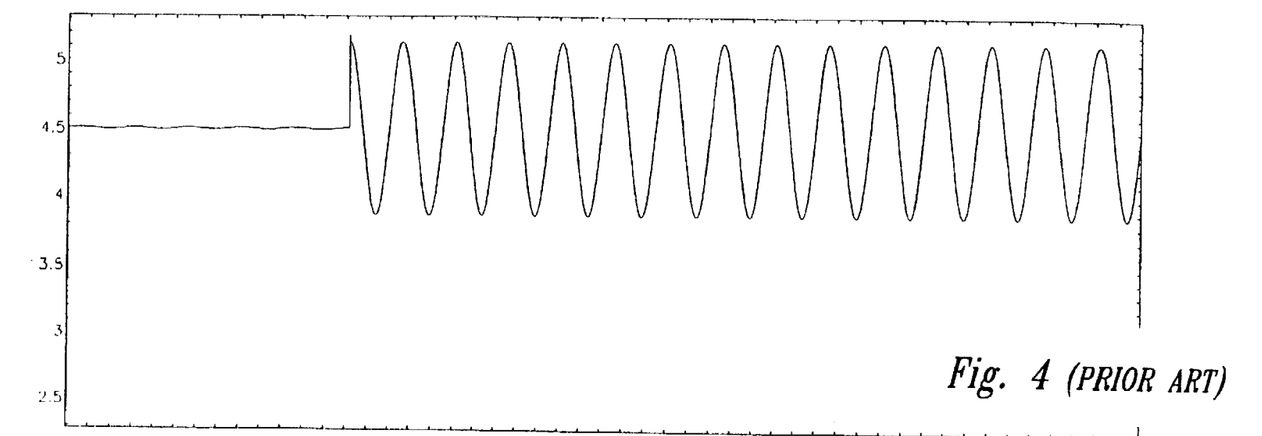
FIGS. 4 and 5 show the switching transients in one and the other direction of change for a 1 KHz sinusoid for the prior art circuit of FIG. 3.
Figure 5:
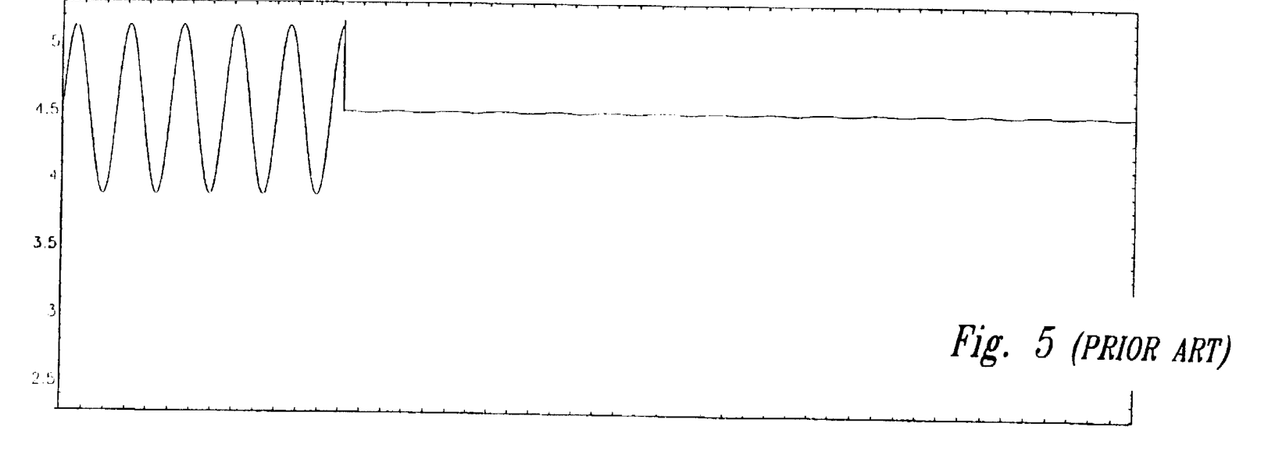

FIGS. 4 and 5 show the switching transient for a 1 KHz sinusoid, respectively for a decrement and an increment of the attenuation as provided by the prior art circuits.

By referring to the circuit diagram of FIG. 3 and supposing that the system be in the condition (A), having the $S_2$ switch closed along the signal path according to the functional scheme illustrated in FIG. 6, the attenuation in such a condition (A) will be given generally by the following expression:

$$A = \frac{R_2 + R_3 + \ldots + R_n}{R_1 + R_2 + R_3 + \ldots + R_n}$$

When, through the digital control of the switches, the system is commanded in a different condition (B) where the $S_3$ switch is the one "selected", then the attenuation becomes:

$$B = \frac{R_3 + \ldots + R_n}{R_1 + R_2 + R_3 + \ldots + R_n}$$

Figure 6:
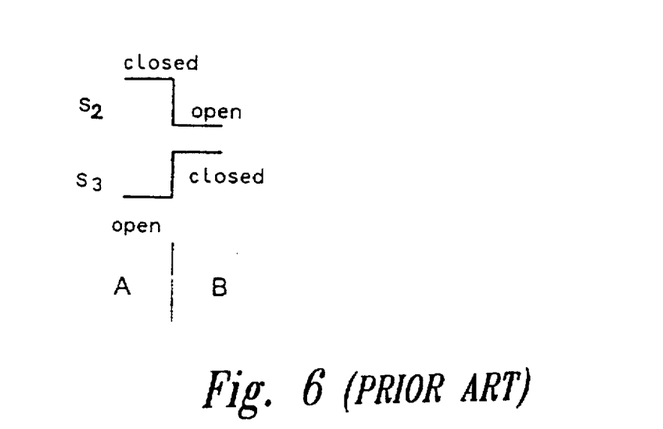
FIG. 6 is an explanatory diagram of the switching mode of the attenuator depicted in FIG. 1 from a condition (A) to a condition (B) and vice versa.

Obviously, a similar amplitude jump occurs when switching over from the condition (B) into the condition (A), as schematically shown in FIG. 6.

In many cases, specially when the configuration of the digitally controlled attenuator is modified through rather large steps, say of 6 to 10 dB, the dynamic distortion that occurs at the switching instant might generate unpleasant audible effects. On the other hand, a more gradual modification of the attenuation might be effected by commanding the execution of a series of attenuation incrementing and decrementing switchings, each switching producing a sufficiently small change of attenuation in order to gradually reach the required (commanded) attenuation level. This system involves a nonnegligible software complication, often incompatible with other requisites of availability of the microprocessor that conducts the execution of adjustment commands for a plurality of functions of the signal processing system.

In audio applications, although not exclusively in these, the problems associated with the "DC step" that occurs upon a fast switching of the switches may cause disturbances that in audio systems may be audible in baseband as a click-like noise as mentioned earlier.

This problem can be minimized by implementing a slow driving, or a "soft-switching" of the passgates subject to switch from a logic state to another. Soft-switchings, obtainable by driving the respective node with purposely generated positive or negative voltage ramps, having a duration in the order of several milliseconds, are indeed able to smooth the DC step thus shifting the disturbance spectrum off the used band, for example off the audio band. In view of the fact that only two logic gates or switches or passgates among the plurality of them composing the array, are directly affected by the switching, it is necessary to discriminate the respective paths among all the n signal paths. All the other paths must remain unalterate, for example by keeping the respective switches open.

A logic circuit for realizing such a soft-switching operation is rather complex and costly in terms of the number of components needed for its realization.

Figure 2:
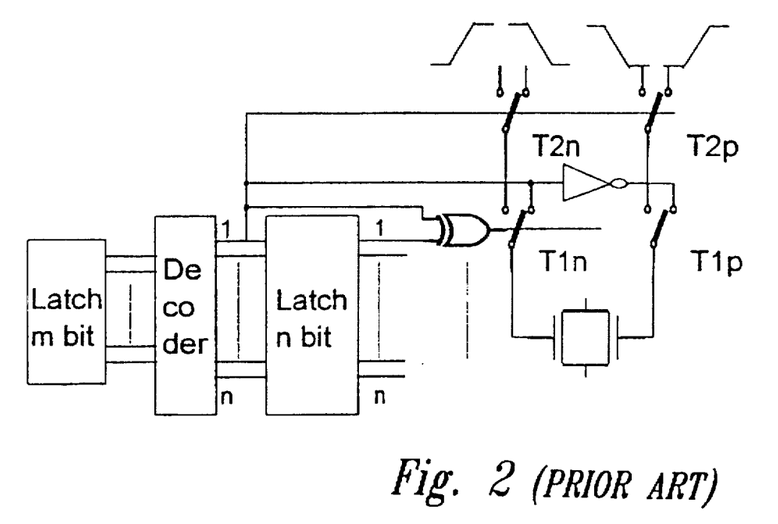
FIG. 2, as already described above, shows a known arrangement for implementing a soft-switching of the passgates of the array of FIG. 1.

FIG. 2 shows a prior art circuit implementing the above described solution schematically depicted in FIG. 1 as could be used with FIG. 3, however, the controlled generators of the required positive and negative voltage ramps, selectable for causing the soft-switching of a certain logic gate or switch or passgate (not shown).

In first place, it is necessary to identify, among the n signal paths which are for instance singularly identifiable by a respective passgate, the two paths that are affected by the commanded transition. For this purpose, it is necessary to use an additional transition detecting circuit, coupled in cascade of the decoder, which can be commonly realized using a latch circuit, followed by a logic gate of the exclusive-OR type (XOR) on each output signal path or line of the decoder. The functioning of the circuit is as follows:

(a) for any one line of the n signal lines that is not affected by the transition, the output of the respective XOR closes the T1 switch, in series with the control gate of the passgate directly on the respective output of the decoder;

(b) for any one line affected by the transition, the output of the respective XOR gate switches the T1 switch in series with the control gate of the passgate, on a node onto which a slow ramp signal generated by a dedicated controlled ramp generator develops.

Depending on the type of gate to be driven (for example the control gate of the NMOS transistor or that of the PMOS transistor of a passgate) and depending on the type of the transition of the respective output of the decoder (for example the opening or closing of a passgate) a positive or negative voltage ramp is selected by the use of a second switch T2. The n-bit latch block, in cascade to the decoder, stores the value that preexisted before the contingent (new) switching for the whole duration of the switching ramp, being ultimately updated by the closing of the switch T1 on the respective decoder output.

According to this solution, as referred to in the above described sample application, the circuit block that has to be interposed in cascade connection, between the n-bit latch circuit and the n-output decoder needed for driving in a slowed down manner the passgates affected by the switching, requires a number of components that may be calculated with the following expression:

$$n_{latch}+n(n_{xor}+n_{switch}+n_{inverter})=30*n+4$$

where:

n=number of decoder outputs
$n_{xor}$=number of components of the XOR=4
$n_{latch}$=number of components of the n-bit latch=n*8+4
$n_{switch}$=number of components of the switches T1p, T2p, T1n, T2n=16
$n_{inverter}$=number of components of the inverter=2.

SUMMARY OF THE INVENTION

It has now been found and is the object of the present invention a way of performing a "soft-switching" of a selected logic gate of an array of logic gates subject to a transition, that requires a number of components markedly reduced if compared to the known ways of performing such a soft-switching.

In view of the difficulties of the prior art, the invention provides a system for effectively suppressing the dynamic distortion due to a change of configuration of a digitally controlled attenuator that does not require any complication of the software, but rather, is capable of suppressing said distortions substantially via hardware, in an extremely simple way.

Fundamentally, the device of this invention is for soft-switching a logic gate subject to a transition from a logic state to another logic state. Soft switching is obtained by driving the logic gate in a gradual fashion to transition from one logic state to another. The soft switching is selectable among a plurality of identical logic gates respectively associated to respective signal lines and which are not simultaneously affected by a transition from a logic state to another logic state. The device includes latches for storing of the preexistent logic state on each signal line and suitable controlled generators of a positive ramp and negative ramp respectively, whose duration may be preestablished, for each signal line. At least an inverter is driven by the signal insistent on the respective line for driving the respective logic gate. The driving inverter has at least one or preferably both its current terminals that may be switched by a passgate between the respective common supply potential node and a node on which said positive or negative voltage ramp toward said respective common supply potential is produced. Each switching passgate of the respective current terminal of the inverter is driven by the logic signal of the respective signal line that preexisted the intervening change of configuration and by its inverse.

Another object of the present invention includes discriminating between a situation of a commanded increment or decrement of the attenuation and to consequently drive in phase opposition a pair of switches that select the signal path downstream of the selection switch that selects the new required level of attenuation or in other words the particular tap of the resistive voltage divider, producing a rapid closing of the switch that is selected via software for modifying the attenuation and a slowed down opening of the deselected switch according to a preestablished switch driving ramp. During the opening phase of the switch deselected by the command of modification of the attenuation, the portion or section of the resistive voltage divider pertaining to the commanded change of tap turns out to be connected in parallel with a shunt resistance whose value is adequate to sensibly reduce the rate of change of the attenuation according to the voltage ramp that drives the opening of the deselected switch.

The result of all this is a gradual decrease or increase of the attenuation towards the new value selected by the digital command, obtained via hardware in an extremely simple way.

The attenuation network of this invention includes use of a pair of switches driven in phase opposition by a circuit capable of discriminating between a command of increment of decrement of the attenuation. The pair of switches have a current terminal coupled in common to a node of the signal path downstream of the attenuation network, while the other current terminals of the switches are respectively connected to one and to the other end of a second resistive voltage divider having a plurality of taps, respectively connected to the switches for the mutually exclusive selection of the taps of the voltage divider of the attenuator.

If in a specific application, it is required to slow down only one of the two switching fronts, for example either the opening or the closing of a passgate, the relative driving inverters of the NMOS and PMOS transistors that form the passgate will have only one current terminal switched by means of a passgate to one or to the other common potential node or to the ramp generator output. Conversely, when wanting to slow down both the closing and opening processes, each driving inverter of the NMOS and PMOS devices of the passgate will have both of their current terminals switched to the respective common potential node or to the ramp generator output by means of a passgate.

BRIEF DESCRIPTION OF THE DRAWINGS

The various aspects and relative advantages of this invention will become even more evident through the following description of several alternative embodiments, and by referring to the attached drawings.

DETAILED DESCRIPTION OF THE INVENTION

In solving the technical problem and in describing the system of the invention that consistently reduces the number of components required, the circuits shown in FIGS. 7–15 refer to the most common case of driving an array of passgates, each of which may be composed of a pair of complementary transistors, for example an NMOS and a PMOS transistor, driven in phase opposition by a logic signal and its inverse. The same considerations and the same effects of the circuit arrangement of the present invention remain valid and may be used in certain circumstances also in the case of driving an array of generic logic gates (not necessarily of the passgate type) or in general terms a plurality (array) of circuital nodes in a mutually exclusive mode at a certain point of a digital code (signal) path.

By referring to FIG. 5, the attenuation network of the invention includes the use of a pair of switches driven in phase opposition (Sup and Sdown), which select the signal path downstream of the tap selection switch ($S_0, S_1, \ldots, S_7$), in function of a logic control signal that discriminates between either an increment or decrement of the attenuation to be implemented by modifying the configuration of the selection switches $S_0, \ldots, S_7$. This information or control signal of the pair of switches Sup and Sdown, may be easily generated by the digital control system, which receives (either by a command of the operator or by an impulse produced by an automatic control system) a certain instruction for modifying the current configuration of the selection switches $S_0, \ldots, S_7$.

For instance, the driving circuit of the pair of switches Sup and Sdown of the attenuation network of the invention may sense the derivative of the attenuation. Such a driving circuit is in itself trivial and many such circuits are well known in the art so that a thorough illustration thereof is not necessary for a description of the invention.

Figure 7:
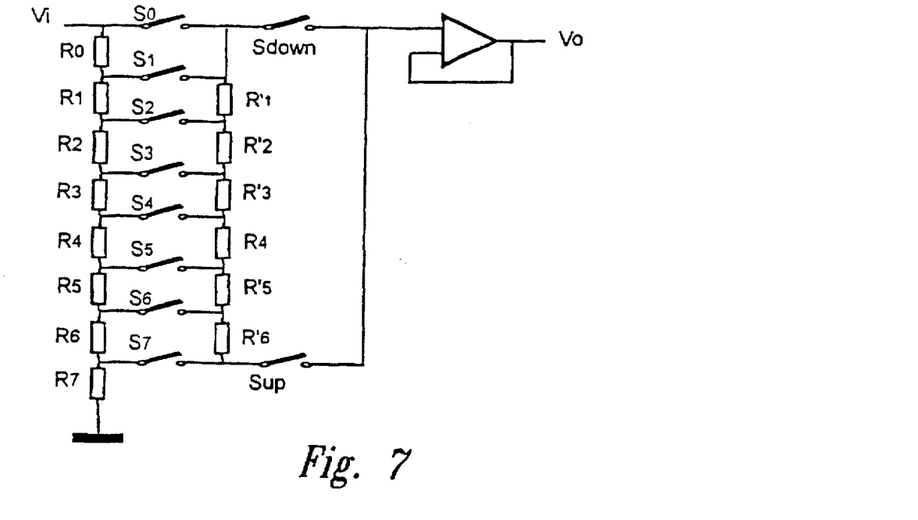
FIG. 7 is a basic circuit diagram of a digitally controlled attenuator made in accordance with the present invention.

According to the invention, the selection switches $S_0 \ldots S_7$ are not connected directly in common to the virtual ground node represented by the input of the output buffer, but instead connected to taps or nodes of a series of supplemental resistors $R_1', R_2' \ldots R_6'$ that form a chain, or second resistive, voltage divider, connected between the discrimination switches, Sup and Sdown, as shown in FIG. 7.

In one embodiment there is one supplemental resistor $R'_1$ between each tap and one tap for each switch $S_1$–$S_7$. In an alternative embodiment, there is one supplemental resistor only between every other tap or there may be fewer taps than one for each switch $S_1$–$S_7$ so that less of a graduated attenuation is provided.

Case A—Increment of the Attenuation

Assume that from a certain level of attenuation, as produced by a configuration where the $S_2$ switch is closed and the others are open, the attenuation must be changed to a higher level by closing the switch $S_3$ and opening the switch $S_2$. The command produced by the digital control system will be such as to determine the Sdown switch to be closed and the Sup switch to be opened as will be performed by the driving circuit. In the above described case, the attenuation for a starting condition (A) will be generally given by the following expression:

$$A = \frac{R_2 + R_3 + \ldots + R_n}{R_1 + R_2 + R_3 + \ldots + R_n}$$

Following to the command of attenuation increment, a suitable logic circuit command a fast closing of the $S_3$ switch, while the opening of the $S_2$ switch is effected by using a relatively slow ramp signal to drive the switch to an OFF state. This can usually be implemented by connecting a capacitor of suitable value to a purposely dedicated external pin of the semiconductor device, so that the driving signal of the switch $S_2$ turns out to be shaped like a ramp, in function of the rise of the voltage on the capacitor (with a certain time constant). Any person of skill in the art is conversant with this well known technique that is widely used, for example when implementing a soft muting function in audio processors. Although requiring a dedicated pin, the use of an external capacitor permits to adapt the time constant to the requirements of a particular application. The attenuation network of the invention is such that following to the fast switching on of the switch $S_3$ and until reaching a complete interdiction of the deselected switch $S_2$, the instantaneous value of the attenuation will be given by an expression of the type below:

$$B' = \frac{R_2'/R_2' + \ldots + R_n}{R_1 + R_2'/R_2' + R_3 + \ldots + R_n}$$

By appropriately dimensioning of the resistors $R'_n$ of the second or supplemental voltage divider, the following conditions are imposed:

$B' < A$ $A - B' \leq \epsilon$ where $\epsilon$ represents the largest change or jump of attenuation short of producing noticeable effects (for example unable to produce an audible clic in audio processors).

The slow turn-off (opening) of the switch $S_3$ determines a gradual approach toward the imposed new level of attenuation (new condition B), that will be given by the following expression:

$$B = \frac{R_3 + \ldots + R_n}{R_1 + R_2 + R_3 + \ldots + R_n}$$

Figure 8:
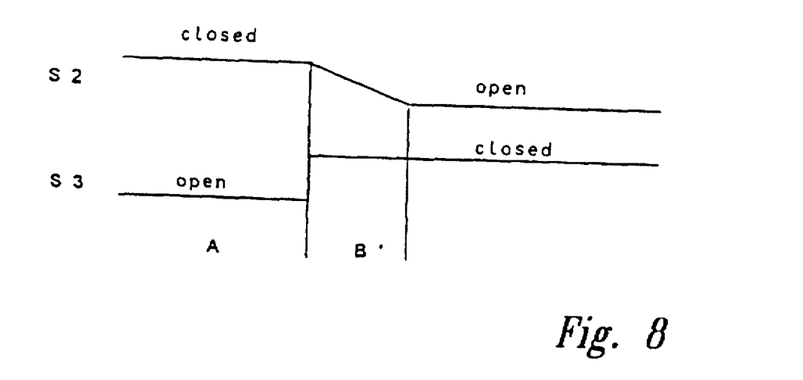
FIGS. 8 and 9 respectively show the functioning mode and a switching transient, respectively, in the case of an increment of the attenuation according to the present invention.

The diagrams of FIG. 8 show in a schematic way the functioning of the system during a phase of increment of the attenuation.

Figure 9:
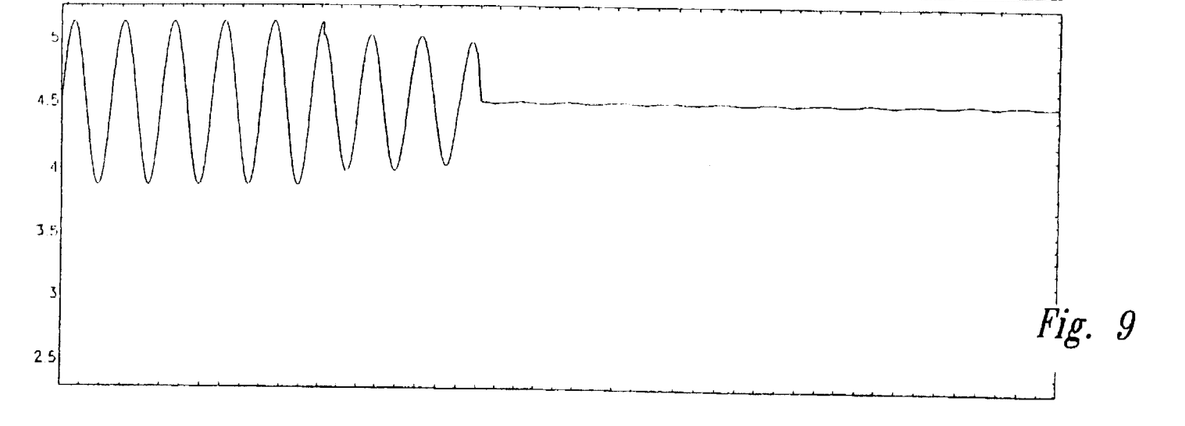

FIG. 9 illustrates a simulated switching transient for the case of a sinusoidal signal having a frequency of 1 KHz to be subjected to an amplitude variation (attenuation) of 40 dB, through a switch ($S_2$) turn-off ramp of 10 milliseconds (ms).

Case B—Decrement of the Attenuation

In this case, the control circuitry or in other words the circuit that senses the derivative of the attenuation, turns on immediately the switch Sup and simultaneously turns off the switch Sdown.

Assuming as a starting condition the one that was attained during the preceding phase of increase of the attenuation, described above and substantially according to which the attenuation (B) is given substantially by the following expression:

$$B = \frac{R_3 + \ldots + R_n}{R_1 + R_2 + R_3 + \ldots + R_n}$$

then, at the time of the fast turn-on of the switch $S_2$ and until the switch $S_3$ reaches a complete off-state, the attenuation will be instantaneously given by the following expression:

$$B' = \frac{R_3 + \ldots + R_n}{R_1 + R_2//R_2 + R_3 + \ldots + R_n}$$

whereby the following conditions will be fulfilled:

B'>B

B'-B≥ε

The slow turn-off of the switch $S_3$ determines a gradual reaching of the final value (A) of the attenuation that is given by the following expression:

$$A = \frac{R_2 + R_3 + \ldots + R_n}{R_1 + R_2 + R_3 + \ldots + R_n}$$

Figure 10:
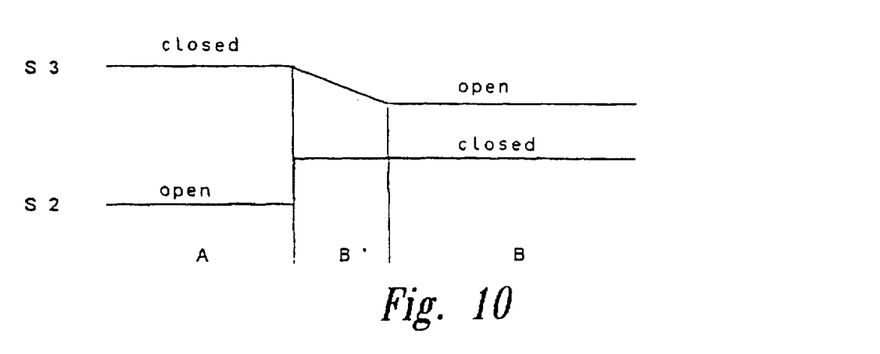
FIGS. 10 and 11 respectively show the functioning mode and a switching transient in the case of a decrement of the attenuation according to the present invention.
Figure 11:
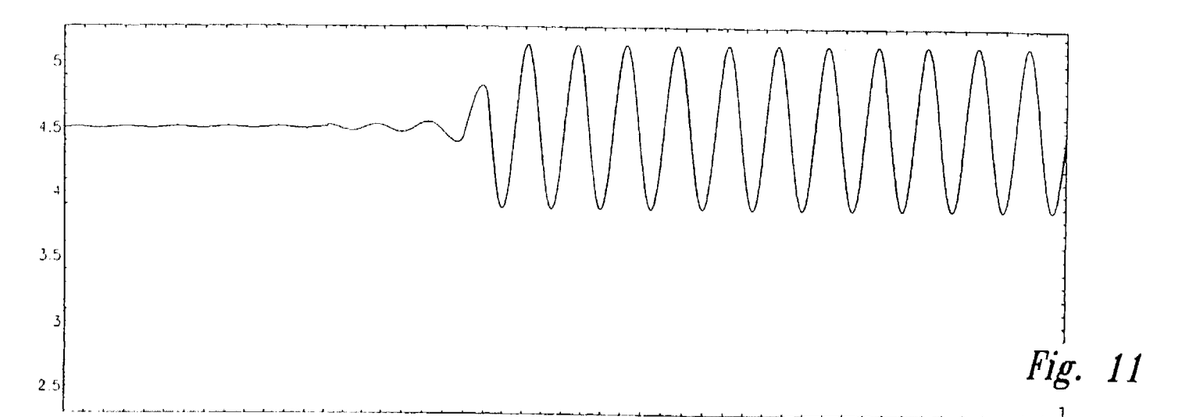

In this case, the operation is diagrammatically shown in FIG. 10, whereas FIG. 11 shows the switching transient obtained by simulation for the case of a sinusoidal signal having a frequency of 1 KHz, undergoing a change of attenuation of 40 dB and using a decrement ramp whose duration is 10 ms.

It is evident that the objective of suppressing the dynamic distortion when commanding large attenuation changes is fully met without resorting to a complication of the software and/or to a burdening of the supervising microprocessor but rather by hardware means with a negligible increment of the circuital complexity.

Moreover, it will be clear to any skilled person that the manner in which the signal for discriminating the direction of the commanded modification of the attenuation level is derived, may be different and in any case easily implementable by the use of extremely simple logic circuits. In addition, there are many other ways of generating a turn-off signal for the deselected switch in the form of a ramp of predefinable duration, besides the one described herein, many such circuits being well known and easily realizable by any technician with ordinary skill in the art of electronic circuits. One acceptable circuit according to the invention for generating the signals of FIGS. 8 and 10 will be shown in FIG. 12.

Figure 12:
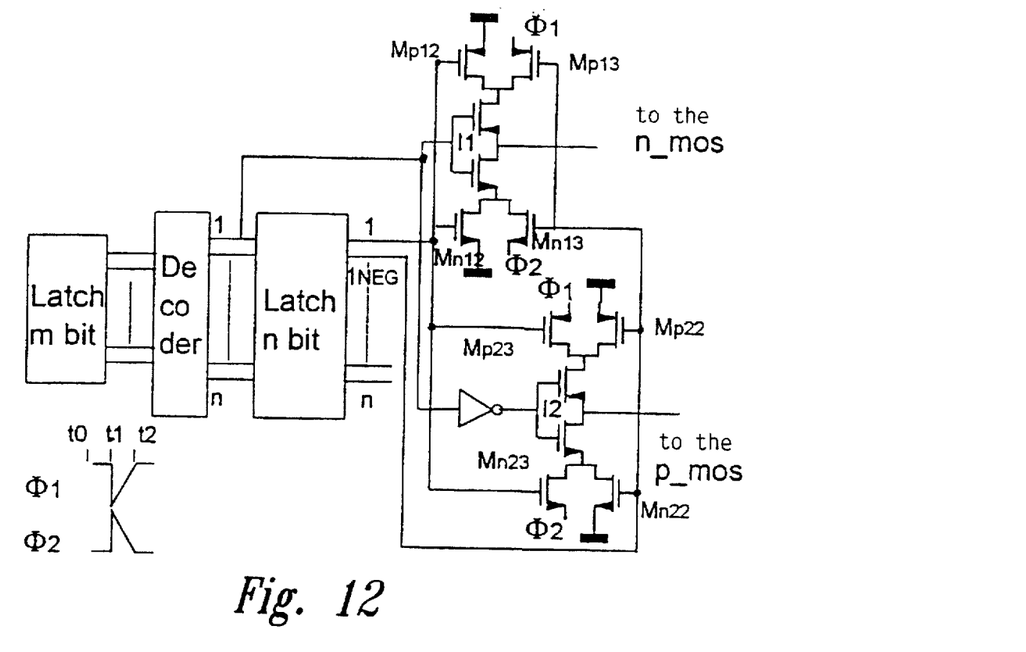
FIG. 12 shows an embodiment of the present invention for implementing a soft switching of the passgates of an array of passgates.
Figure 13:
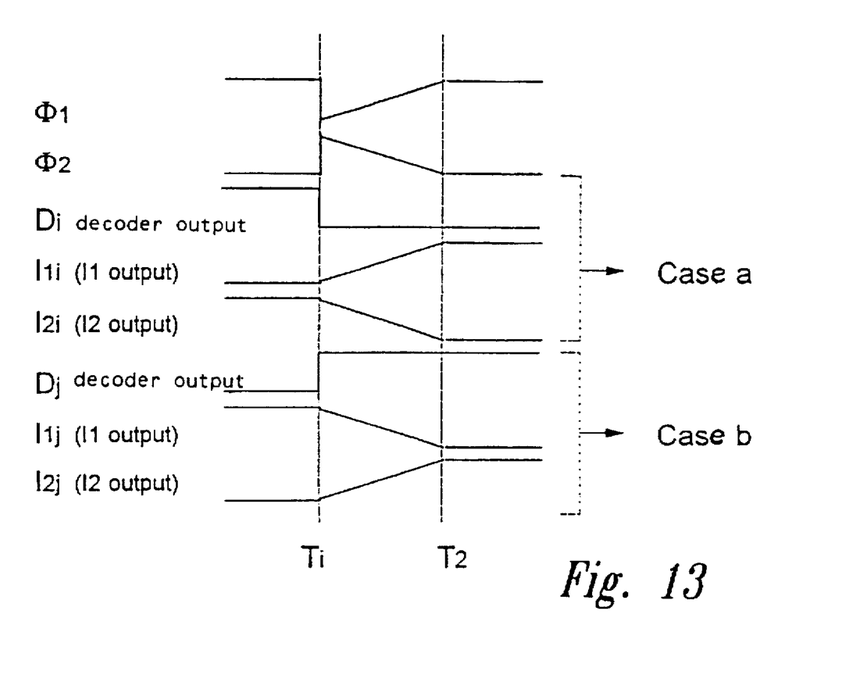
FIG. 13 is a diagram of the signals for two different situations of operation of the circuit of the invention of FIG. 12.

Referring now to the circuit diagram of FIG. 12, the n-bit latch block, placed in cascade to the decoder, stores the configuration (sometimes called code) prior to a new change of configuration (switching) and is then updated to the new configuration (code) at the end of the switching process governed by slow ramp drive signals $\phi 1$ and $\phi 2$ generated by suitable generators (not shown in the figure) as such are well known in prior art arrangements such as the one described in FIG. 2.

Differently from the known solution of FIG. 2, the driving architecture of the invention for effecting slow, or soft switchings from one logic state to another, consists essentially in the use of an inverter driven by the logic value present on the respective signal line at the decoder output for driving the respective logic gate or, in the example shown, the control gate of one of the two complementary transistors of the respective passgate obviously duplicating the same driving structure for the other transistor of the pair forming the passgate.

In the embodiment depicted in FIG. 12, both the inverters, I1 and I2, have their respective current terminals switchable by a passgate between the respective common supply potential node and a node upon which a negative $\phi 1$ or positive $\phi 1$ voltage ramp toward said respective common potential develops, as depicted or indicated in the relative diagram shown in FIG. 12. I2 is driven by an inverter capable to invert the logic signal present at the respective decoder output.

The passgates that switch the current terminals of the n pairs of inverters I1 and I2 are controlled by the logic signal that preexisted on the relative signal line before the intervened switching and by its inverse signal, which are available at the n output pairs of the n-bit latch that stores the preexistent configuration or code.

The different situations that can occur during operation for the ith output of the n-bit decoder are described as follows.

Case a): high-to-low switching of the ith output of the decoder Initial condition at instant $t_0$ ith output of the n-bit decoder=ith output of the n-bit latch=high $\phi 1$=Vdd $\phi 2$=Gnd Mn12=closed; Mn13=open; Mp12=open; Mp13=closed therefore the inverter $I_1$ is supplied between $\phi 1$=Vdd and Gnd $I_1$ output=low Mn22=open; Mn23=closed; Mp22=closed; Mp23=open therefore the inverter I2 is supplied between Vdd and $\phi 2$=Gnd $I_2$ output=high Fast switching high-to-low of the output of the decoder at instant $t_1$ ith output of the n-bit decoder=low ith output of the latch n-bit=high Mn12=closed; Mn13=open; Mp12=open; Mp13=closed as a $t_0$, being driven by the latch; $\phi 1$=Gnd, therefore $I_1$ output remains low. Mn22=open; Mn23=closed; Mp22=closed; Mp23=open as a to being driven by the latch; $\phi 2$=Vdd, therefore $I_2$ output remains high.

Interval $t_1$-$t_2$ ith output of the n-bit decoder=low ith output of the n-bit latch=high $\phi 1$ is linearly driven to Vdd, which is reached at the instant $t_2$; the inverter $I_1$ presents the PMOS switched-on and the NMOS switched-off, so the PMOS drain current is negligible and its Vds is null. Therefore the output $I_1$ follows the course of $\phi 1$. $\phi 2$ is linearly driven to Gnd, which is reached at the instant $t_2$; the inverter $I_2$ presents the NMOS switched-on and the PMOS switched-off, so the NMOS drain current is negligible and its Vds is null. Therefore the output $I_2$ follows the course of $\phi 2$.

Instant $t_2$ the n-bit latch is up-dated; ith output of the n-bit decoder=low ith output of the n-bit latch=low $\phi1$=Vdd $\phi2$=Gnd Mn12=open; Mn13=closed; Mp12=closed; M13= open therefore the inverter $I_3$ is supplied between Vdd and $\phi2$=Gnd $I_1$ output=high Mn22=closed; Mn23=open; Mp22= open; Mp23=closed therefore the inverter I2 is supplied between $\phi1$=Vdd and Gnd I2 output=low Case b): slow-to-high switching of the jth output of the decoder Initial condition at instant to jth output of the n-bit decoder=jth output of the n-bit latch=low $\phi1$=Vdd $\phi2$=Gnd Mn12=open; Mn13=closed; Mp12=closed; Mp13=open therefore the inverter $I_1$ is supplied between Vdd and $\phi2$=Gnd $I_1$ output=high Mn22=closed; Mn23=open; Mp22= open; Mp23=closed therefore the inverter $I_2$ is supplied between $\phi1$=Vdd and Gnd $I_2$ output=low Fast switching slow-to-high of the output of the decoder at instant $t_1$ jth output of the n-bit decoder=high jth output of the latch n-bit=low Mn12=open; Mn13=closed; Mp12=closed; Mp13=open as a $t_0$, being driven by the latch; $\phi2$=Vdd from which $I_1$ output remains high. Mn22=closed; Mn23=open; Mp22=open; Mp23=closed as a $t_0$ being driven by the latch; $\phi1$=Gnd from which $I_2$ output remains low.

Interval $t_1$–$t_2$ jth output of the n-bit decoder=high jth output of the n-bit latch=low $\phi2$ is linearly driven to Gnd, which is reached at the instant $t_2$; the inverter $I_1$ presents the NMOS switched-on and the PMOS switched-off, so the NMOS drain current is negligible and its Vds is null. Therefore the output $I_1$ follows the course of $\phi2$. $\phi1$ is linearly driven to Vdd, which reaches as a value at the instant $t_2$; the inverter $I_2$ presents the PMOS switched-on and the NMOS switched-off, so the PMOS drain current is negligible and its Vds is null. Therefore the output $I_2$ follows the course of $\phi1$.

Instant $t_2$ the n-bit latch is up-dated; jth output of the n-bit decoder=high jth output of the n-bit latch=high $\phi1$=Vdd $\phi2$=Gnd Mn12=closed; Mn13=open; Mp12=open; Mp13= closed therefore the inverter $I_1$ is supplied between $\phi1$=Vdd and Gnd. $I_1$ output=low Mn22=open; Mn23=closed; Mp22=closed; Mp23=open therefore the inverter $I_2$ is supplied between Vdd and $\phi2$=Gnd. $I_2$ output=high.

Case c): no switching of the kth output of the decoder=high Initial condition at instant $t_0$ kth output of the n-bit decoder=kth output of the n-bit latch=high $\phi1$=Vdd $\phi2$=Gnd Mn12=closed; Mn13=open; Mp12=open; Mp13=closed therefore the inverter $I_1$ is supplied between $\phi1$=Vdd and Gnd $I_1$ output=low Mn22=open; Mn23=closed; Mp22= closed; Mp23=open therefore the inverter $I_2$ is supplied between Vdd and $\phi2$=Gnd $I_2$ output=high Instant $t_1$ kth output of the n-bit decoder=kth output of the n-bit latch=high $\phi1$=Gnd $\phi2$=Vdd Mn12=closed; Mn13= open; Mp12=open; Mp13=closed as a $t_0$, being driven by the latch; the $I_1$ inverter works between $\phi1$ and Gnd, but as its respective PMOS is switched-off the output does not suffer the transition on $\phi1$, which is maintained low by the NMOS switched-on (its drain current is negligible and its Vds is null); therefore the output $I_1$=low Mn22=open; Mn23= closed; Mp22=closed; Mp23=open as a $t_0$ being driven by the latch; the inverter $I_2$ works between Vdd and $\phi2$, but as its respective NMOS is switched-off the output does not suffer the transition on $\phi2$, which is maintained high by the PMOS switched-on (its drain current is negligible and its Vds is null); therefore the output $I_2$=high Interval $t_1$–$t_2$ kth output of the n-bit decoder=kth output of the n-bit latch=high $\phi1$ is linearly driven to Vdd, which is reached at the instant $t_2$; the inverter $I_1$ works between $\phi1$ and Gnd, but as its respective PMOS is switched-off the output does not suffer the transition on $\phi1$, which is maintained low by the NMOS switched-on (its drain current is negligible and its Vds is null). $\phi2$ is linearly driven to Gnd, which reaches as a value at the instant $t_2$; the inverter $I_2$ works between Gnd and $\phi2$, but as its respective NMOS is switched-off the output does not suffer the transition on $\phi2$, which is maintained high by the PMOS switched-on (its drain current is negligible and its Vds is null);

Instant $t_2$ the n-bit latch is up-dated; kth output of the n-bit decoder=kth output of the n-bit latch=high $\phi1$=Vdd $\phi2$=Gnd Mn12=closed; Mn13=open; Mp12=open; Mp13=closed as a $t_0$ being driven by the latch; therefore the output $I_1$ remains low. Mn22=open; Mn23=closed; Mp22=closed; Mp23= open as a to being driven by the latch; therefore the $I_2$ output remains high.

Case d): no switching of the pth output of the decoder=low Initial condition at instant $t_0$ pth output of the n-bit decoder=pth output of the n-bit latch=low $\phi1$=Vdd $\phi2$=Gnd Mn12=open; Mn13=closed; Mp12=closed; Mp13=open therefore the inverter $I_1$ is supplied between Vdd and $\phi2$=Gnd. $I_1$ output=high Mn22=closed; Mn23=open; Mp22=open; Mp23=closed therefore the inverter $I_2$ is supplied between $\phi1$=Vdd and Gnd. $I_2$ output=low Instant $t_1$ pth output of the n-bit decoder=pth output of the n-bit latch=low $\phi1$=Gnd $\phi2$=Vdd Mn12=open; Mn13= closed; Mp12=closed; Mp13=open as a $t_0$, being driven by the latch; the $I_1$ inverter works between Vdd and $\phi2$, but as its respective NMOS is switched-off the output does not suffer the transition on $\phi2$, which is maintained high by the PMOS switched-on (its drain current is negligible and its Vds is null); therefore the output $I_1$=high Mn22=closed; Mn23=open; Mp22=open; Mp23=closed as a $t_0$ being driven by the latch; the inverter $I_2$ works between $\phi1$ and Gnd, but as its respective PMOS is switched-off the output does not suffer the transition on $\phi1$, which is maintained low by the NMOS switched-on (its drain current is negligible and its Vds is null); therefore the output $I_2$ remains low.

Interval $t_1$–$t_2$ pth output of the n-bit decoder=pth output of the n-bit latch=low $\phi1$ is linearly driven to Gnd, which is reached at the instant $t_2$; the inverter $I_1$ works between Vdd and $\phi2$, but as its respective NMOS is switched-off the output does not suffer the transition on $\phi2$, which is maintained high by the PMOS switched-on (its drain current is negligible and its Vds is null). $\phi1$ is linearly driven to Vdd, which is reached at the instant $t_2$; the inverter $I_2$ works between $\phi1$ and Gnd, but as its respective PMOS is switched-off the output does not suffer the transition on $\phi1$, which is maintained low by the NMOS switched-on (its drain current is negligible and its Vds is null); therefore the output $I_2$ remains low.

Instant $t_2$ the n-bit latch is up-dated; pth output of the n-bit decoder=pth output of the n-bit latch=low $\phi1$=Vdd $\phi2$=Gnd Mn12=open; Mn13=closed; Mp12=closed; Mp13=open as a $t_0$ being driven by the latch; therefore the output $I_1$ remains high. Mn22=closed; Mn23=open; Mp22=open; Mp23= closed as a $t_0$ being driven by the latch; therefore the $I_2$ output remains low.

Diagrams of the signals for the cases a) and b) described above are shown in FIG. 13.

The circuit shown in the diagram of FIG. 12 for the driving circuit according to the present invention that is interposed in cascade to the decoder for "soft-switching" the passgates, can be compared to that of the prior art known arrangement of FIG. 2, by considering the number of components that is given by the following expression:

$$n_{latch}+n(n_{new}+n_{inverter})=22*n+4$$

where:
n=number of outputs of the decoder $n_{latch}$=number of components of the n-bitlatch=n*8+4

$n_{new}$=number of components of the driving circuit module that drives each MOS of the passgate=6

$n_{inverter}$=number of components of the inverter=2.

If we consider the number of decoder outputs equal to eight (n=8), as is commonly the case for a large number of applications, the present invention provides a 27% decrease in the total number of components if compared to a known architecture like that described in FIG. 2.

The real effects upon the reduction die-size occupied are much greater than a simple decrease in the total number of components, because all the components required by the driving architecture of the invention may be devices of a minimum size. This is not entirely possible according to the known approaches, because in order to ensure a sufficiently fast reconfiguration of the driving circuit of the prior art, the switches of the scheme shown in FIG. 2 need to be implemented with integrated devices of adequate size, usually substantially larger than the minimum size. Moreover, the peculiar compactness made possible in a layout of the driving circuit of the invention provides for a more efficient connectivity and for a reduced utilization of silicon area for wiring the components as compared to the known solution of FIG. 2.

Naturally, the invention can be also practiced in different ways depending on the specific requirements of the whole system. In particular, if the system requires a soft-switching or gradual change in attentuation only during one phase, either of opening or closing of the passgate, the number of components may be reduced accordingly.

Figure 14:
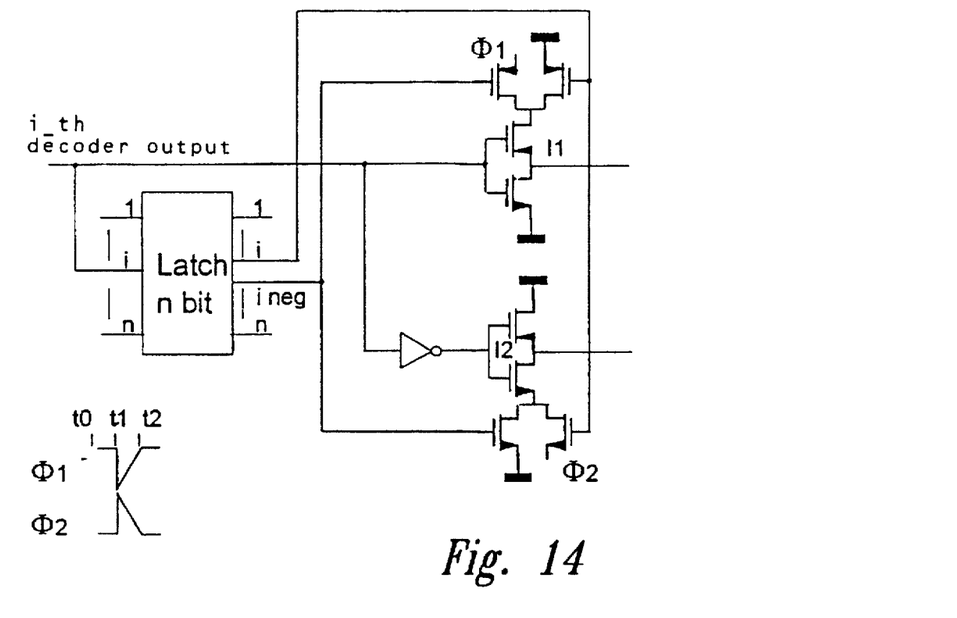
FIG. 14 is a partial scheme of a passgate driving circuit according to this invention for the case wherein only one type of transition is to be slowed-down by applying a ramp drive signal.

This reduced form of an embodiment is schematically shown in FIG. 14. In this case only the current terminal toward supply voltage node of the inverter I1 and only the current terminal toward the ground of the inverter I2 are switchable by a respective passgate between the relative supply node and a node upon which a positive or negative voltage ramp, respectively, is produced by a suitable ramp generator.

Figure 15:
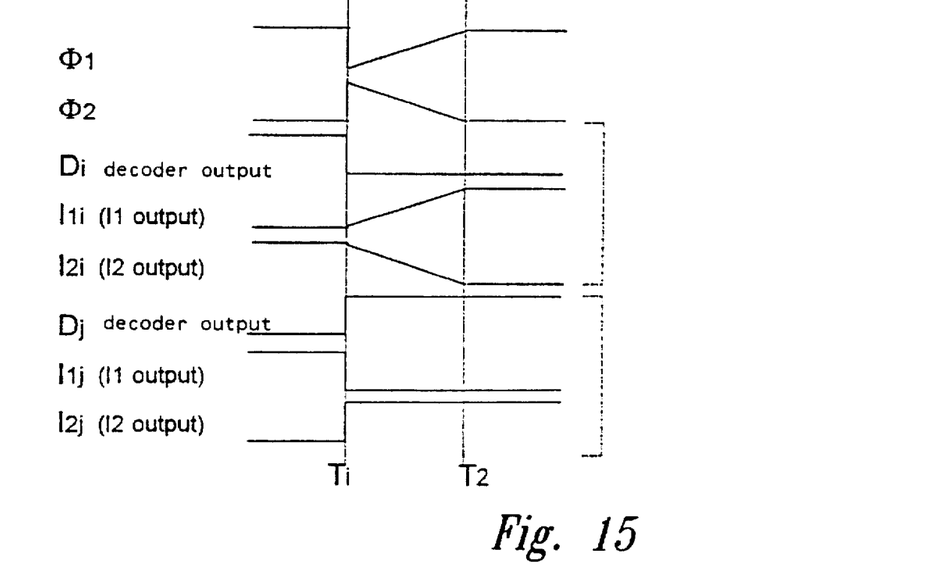
FIG. 15 is a diagram of the signals of the circuit of FIG. 5.

Diagrams of the signals of the circuit of FIG. 14 are shown in FIG. 15.

The operation of the circuit of FIG. 14 will be apparent from reviewing FIG. 15 and comparing it to the operation of FIG. 12.

The invention is particularly useful in analog audio processors in which the adjustment of certain functional parameters is performed by means of digital commands. It may also be used in other environments to provide a more gradual switching of the attenuation value in a given signal.

We claim:

1. A circuit for driving in a gradual switching fashion a logic gate subject to undergo a transition from a logic state to another, comprising:

a latch for storing the logic state preexistent a current switching command;

at least one inverter, driven by the logic signal insistent on a respective input signal line, driving a control node of the logic gate;

means for coupling said control node of the logic gate to a generator of a negative or positive signal ramp depending on the direction of said transition; and a passgate coupled in series to at least one of the two current terminals of said inverter for switching the inverter terminal from the respective common supply potential node to a node on which said ramp signal toward said common supply potential is produced, said passgate being controlled by the preexistent stored logic signal stored in said latch and by its inverse.

2. The circuit as defined in claim 1 wherein said passgate controlled by said preexistent logic signal and its inverse is coupled in series to each of the current terminals of said inverter that are switchable between their respective common supply potential node and a node on which said ramp signal toward said supply potential is produced.

3. The circuit as defined in claim 1 wherein said logic gate is a passgate, the n channel transistor of which is controlled by a first inverter driven by the logic signal present on the respective input signal line and the p channel transistor of which is controlled by a second inverter driven by the inverse of said logic signal;

each inverter having a passgate coupled in series with at least a current terminal of the inverter for switching it from its respective common supply potential node to a node on which said ramp signal toward said respective common supply potential is produced; and said passgates coupled in series to the current terminal of the inverters being driven by the preexistent logic signal stored in said latch and by its inverse.

4. A method of switching a logic gate subject to undergo a transition from one logic state to another, comprising the steps of:

storing in a latch of the logic state preexisting a current switching command;

coupling the control node of said logic gate to a generator of a positive or negative voltage ramp signal depending on the direction of said transition; and driving said control node of the logic gate through an inverter and switching at least a current terminal of the inverter from the respective common supply potential node to a node on which said voltage ramp signal toward the respective common supply potential is produced by using a passgate controlled by said stored preexistent logic signal and its inverse.

5. The method as defined in claim 4 wherein both the current terminals of said inverter are switched by means of a respective passgate from the respective common supply potential node to a node on which said ramp signal toward said supply potential is produced.

6. The method as defined in claim 4 wherein said logic gate subject to a transition from a logic state into another is a passgate having an n channel and a p channel transistor and further comprises the steps of:

driving the n channel transistor of the passgate by means of a first inverter driven by an input logic signal;

driving the p channel transistor of said passgate by means of a second inverter driven by the inverse of said input logic signal; and switching at least one current terminal of each inverter from the respective common supply potential node to a node on which said voltage ramp signal toward the respective common supply potential is produced by means of a respective passgates controlled by the stored preexisting logic signal and its inverse.

7. An analog audio processor having a circuit for driving in a gradual switching fashion a logic gate that undergoes a transition from one logic state to another, comprising:

a latch for storing the logic state preexistent a current switching command;

at least one inverter, driven by the logic signal insistent on a respective input signal line, driving a control node of the logic gate;

means for coupling said control node of the logic gate to a generator of a negative or positive signal ramp depending on the direction of said transition;

a passgate coupled in series to at least one of the two current terminals of said inverter for switching the inverter terminal from the respective common supply potential node to a node on which said ramp signal toward said common supply potential is produced, said passgate being controlled by the preexistent stored logic signal stored in said latch and by its inverse; and means for controlling a certain functioning parameter, including a digitally commanded, in a mutually exclusive mode, of logic gates of n multiplated signal corresponding to respective outputs of a decoder of a multibit digital command.

* * * * *